United States Patent
Mastro et al.

(10) Patent No.: US 7,790,230 B2
(45) Date of Patent: Sep. 7, 2010

(54) METAL CHLORIDE SEEDED GROWTH OF ELECTRONIC AND OPTICAL MATERIALS

(75) Inventors: Michael A Mastro, Alexandria, VA (US); Jaime A. Freitas, Burke, VA (US); Charles R. Eddy, Jr., Columbia, MD (US); Jihyun Kim, Incheon (KR)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 79 days.

(21) Appl. No.: 12/022,178

(22) Filed: Jan. 30, 2008

(65) Prior Publication Data

US 2009/0191339 A1   Jul. 30, 2009

(51) Int. Cl.
*C23C 16/08* (2006.01)
(52) U.S. Cl. .......... 427/255.39; 427/255.394; 427/166; 204/192.1
(58) Field of Classification Search ........... 427/255.39, 427/255.394, 166; 204/192.1
See application file for complete search history.

(56) References Cited

U.S. PATENT DOCUMENTS

| | | | | |
|---|---|---|---|---|
| 6,086,673 | A * | 7/2000 | Molnar .......... | 117/90 |
| 7,482,674 | B1 * | 1/2009 | Freitas et al. .......... | 257/613 |
| 2004/0104391 | A1 * | 6/2004 | Maeda et al. .......... | 257/79 |
| 2005/0043184 | A1 * | 2/2005 | McCleskey et al. .......... | 505/100 |
| 2005/0098095 | A1 * | 5/2005 | D'Evelyn et al. .......... | 117/105 |
| 2006/0087000 | A1 * | 4/2006 | Okuno .......... | 257/506 |
| 2006/0257626 | A1 * | 11/2006 | Schlesser et al. .......... | 428/141 |
| 2007/0218703 | A1 * | 9/2007 | Kaeding et al. .......... | 438/775 |
| 2008/0050857 | A1 * | 2/2008 | Wu et al. .......... | 438/47 |

OTHER PUBLICATIONS

Mastro, M.A., et al., "Rare-earth chloride seeded growth of GaN nano- and micro-crystals". Applied Surface Science 253 (2007) pp. 6157-6161.*

Hashimoto et al., "Local structure of rare-earth-doped diluted magnetic semiconductor GaGdN" Phys. Stat. Sol. (C), 0(7), 2650-2653 (2003).

Kuykendall et al., "Metalorganic Chemical Vapor Deposition Route to GaN Nanowires with Triangular Cross Sections" Nano Lett., 3(8), 1063-1066 (2003).

Mastro et al., "Rare-earth chloride seeded growth of GaN nano- and micro-crystals" Applied Surface Science, 253 (2007) 6157-6161.

Song et al., "Crystal Overgrowth on Gold Nanorods: Tuning the Shape, Facet, Aspect Ratio, and Composition of the Nanorods" Chem. Eur. J., 2005, 11, 910-916.

(Continued)

*Primary Examiner*—Bret Chen
(74) *Attorney, Agent, or Firm*—Amy L. Ressing; Joseph T. Grunkemeyer

(57) ABSTRACT

A method of deposition by: depositing a metal halide on a substrate; providing a vapor that forms a material by way of chemical vapor deposition; heating the metal halide to a temperature at or above the melting point of the metal halide and at or below the melting point of the material; and contacting the metal halide with the vapor to cause growth on the substrate of a solid solution of the metal halide in the material. The metal is a rare earth metal or a transition metal.

16 Claims, 11 Drawing Sheets

OTHER PUBLICATIONS

Stach et al., "Watching GaN Nanowires Grow" Nano Lett., 3(6), 867-869 (2003).

Xia et al., "One-Dimensional Nanostructures: Synthesis, Characterization, and Applications" Adv. Mater., 25(5), 353-389 (2003).

* cited by examiner

METAL CHLORIDE SEEDED GROWTH OF ELECTRONIC AND OPTICAL MATERIALS

FIELD OF THE INVENTION

The invention is generally related to growth of electronic and optical materials using metal chloride seeds.

DESCRIPTION OF RELATED ART

The group III-nitride material system has proven to be well suited for the production of large-scale light emitting diodes (LEDs), detectors and lasers. The fabrication and integration of efficient optoelectronic devices at the nano-scale is more complex. One major challenge to all nano-scale devices is the ability to pre-determine the placement of the device. Several reports have shown that metal (typically Ga, Ni, Fe, or Au) seeded vapor-liquid-solid (VLS) growth can define the placement and, to a lesser degree, the orientation of the GaN nano-structure as well as improve the quality of the nano-structure relative to a continuous film (Stach et al., *Nano Lett.*, 3, 867 (2003); Xia et al., *Adv. Mater.*, 15, 353 (2003); Kuykendall et al., *Nano. Lett.*, 3, 1063 (2003); Song et al., *Chem. Euro. J.*, 11, 910 (2005). All referenced publications and patent documents are incorporated herein by reference.) A second limitation to the practical introduction of nano-scale structures is the ability to fabricate stand-alone functional devices that can be contacted and, thus, integrated into a large scale circuit. The traditional III-nitride optoelectronics, based on a planar quantum well structure surrounded by a p-n junction with metal contacts, are difficult to integrate as a nano-wire or rod geometry particularly into Si microelectronics.

The band structure of GaN is advantageous for the fabrication of rare-earth based optoelectronics; specifically, GaN is transparent in the visible regime, has high chemical and thermal stability, and can support hot carrier impact excitation up to the intrinsic breakdown voltage of 3 MV/cm. Quenching of the emission from the trivalent Er ion in GaN is minimal even at high dopant concentrations or at high temperature operation, which is in contrast to the problematic quenching effects observed for rare-earth ionis in narrow bandgap semiconductors. Additionally, the high excitonic ionization energy in GaN is advantageous for efficient electrical excitation of $Er^{3+}$ centers.

The thermodynamically predicted solubility of the standard metal (Ga, Ni, Fe, or Au) seeds for VLS growth is intentionally low to prevent deleterious modification of the properties of the host semiconductor matrix, e.g., GaN, Si, GaAs.

Traditionally, deposition of these materials takes place in a molecular beam epitaxy system that can deliver the rare earth element directly from the source effusion cell (Rack et al., *Mater. Sci. Eng., R.*, 21, 171 (1998); Steckl et al., *Appl. Phys. Lett.*, 73, 1700 (1998)). The difficulty in delivering rare earth elements via a metal organic source has prevented the introduction of rare earth dopants in a metal organic chemical deposition (MOCVD) system. Nearly all commercial GaN-based optoelectronic devices and many other structures supporting optoelectronic functionality are produced by MOCVD due to the favorable chemical kinetics of the system (Nakamura et al., The Blue Laser Diode (Springer, Berlin, 2000); Mastro et al., *Jpn. J. Appl. Phys.*, 45(31), L814 (2006); Mastro et al., *Appl. Phys. Lett.* 87, 241103 (2005)). Thus, it is desirable to extend the capabilities of this tool to optoelectronic devices based on rare-earth ion transitions.

SUMMARY OF THE INVENTION

The invention comprises a deposition method comprising: depositing a metal halide on a substrate; providing a vapor that forms a material by way of chemical vapor deposition; heating the metal halide to a temperature at or above the melting point of the metal halide and at or below the melting point of the material; and contacting the metal halide with the vapor to cause growth on the substrate of a solid solution of the metal halide in the material. The metal is a rare earth metal or a transition metal.

BRIEF DESCRIPTION OF THE DRAWINGS

A more complete appreciation of the invention will be readily obtained by reference to the following Description of the Example Embodiments and the accompanying drawings.

DETAILED DESCRIPTION OF EXAMPLE EMBODIMENTS

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods and devices are omitted so as to not obscure the description of the present invention with unnecessary detail.

Disclosed herein is a route via a metal halide seed, for example rare-earth chloride seed such as erbium trichloride ($ErCl_3$), for catalyst-assisted growth of materials such as III-nitride nano-structures. A chloride compound may be used to lower the melting point of the rare-earth seed below the GaN growth temperature and, thus, allow a catalyst enhanced growth mechanism that also improves the solubility of the rare-earth ion into the GaN matrix. The method utilizes the high solubility for incorporating rare earth ionis substitutionally on the cation Ga sublattice of GaN (Steckl et al., *MRS Bull.*, 24(9), 33 (1999)). The incorporation of rare-earth elements into a semiconductor matrix allows tunable optical transitions based on selection of the appropriate rare-earth dopants. In GaN, this is particularly interesting for an $Eu^{3+}$ ion with an emission peak in the red as well as an $Er^{3+}$ ion with transitions in the green and an infrared transition at approximately 1550 nm, which is the dominant wavelength for fiber optic communications.

In addition to any optoelectronic motivation, the method may also allow for chloride-seeded fabrication technique for nano- or micro-scale, spintronic devices based on diluted magnetic semiconductor (DMS) in which the crystal exhibits long-range ferromagnetic order when heavily doped with, for example, a rare-earth ion such as Gd (Hashimoto et al., *Phys. Stat. Sol.* (*c*), 0(7), 2650 (2003)). The potential reduced growth temperature of the catalyst-assisted deposition process presented in this method may also permit the high level of rare-earth ion incorporation that is necessary to reach a curie temperature higher than room temperature (Choi et al., *Adv. Mater.*, 17, 1351 (2005)). Additionally, the wide bandgap of sapphire may be advantageous for the formation of a DMS on insulator structure.

Figure 1:
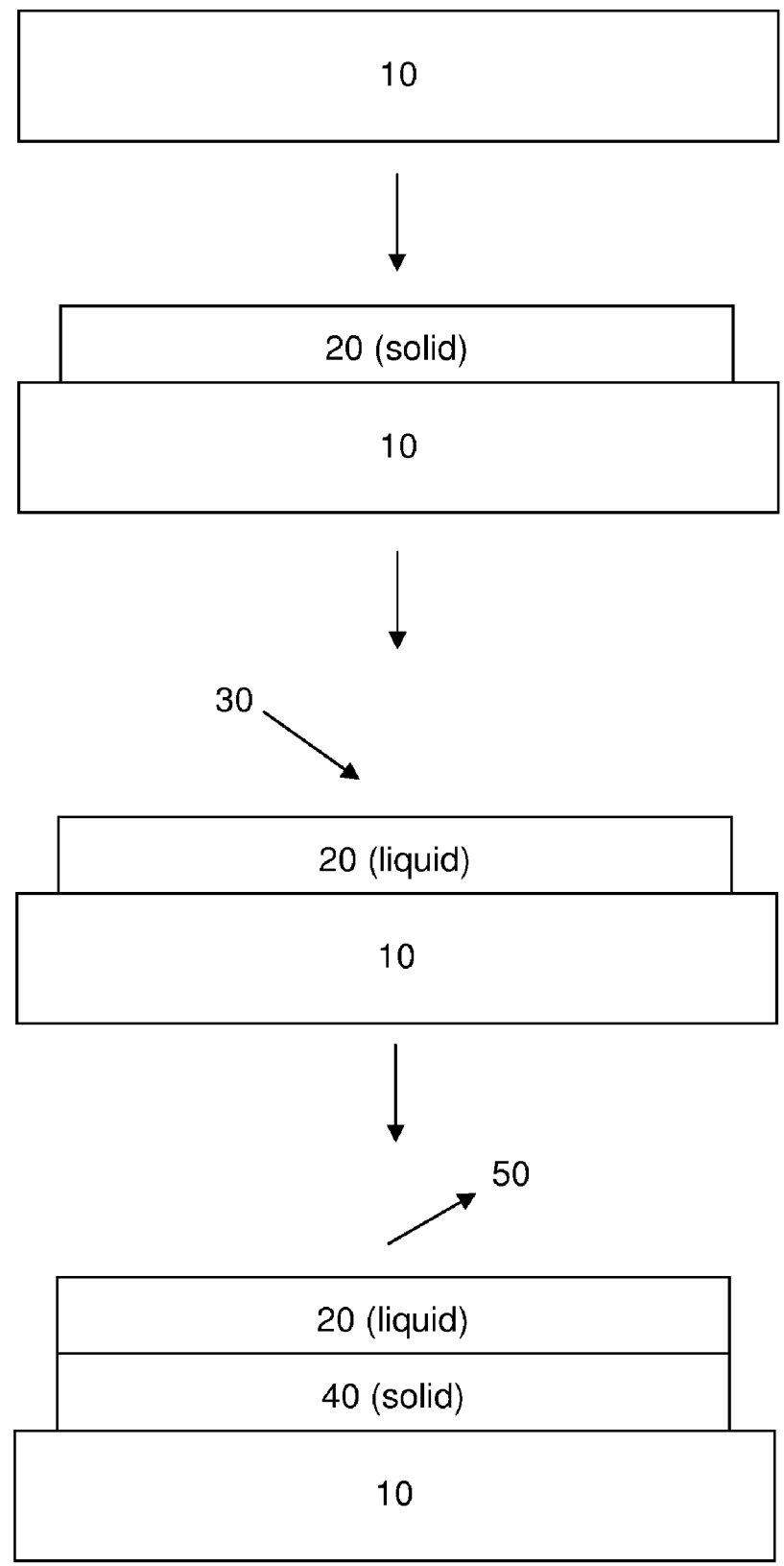
FIG. 1 schematically illustrates the disclosed method.

FIG. 1 schematically illustrates each stage of the method. Initially, a substrate 10 is provided. Suitable substrates include, but are not limited to, sapphire, SiC, silicon, ZnO, $LiGaO_2$, $LiAlO_2$, MgO, AlN, and GaN and any of these with a III-nitride layer on the surface of the substrate. Next, a rare earth metal or transition metal halide 20 is deposited on the substrate 10. At room temperature the metal halide 20 would generally be a solid. Suitable metal halides include, but are not limited to, a metal chloride, erbium chloride, rare earth chloride, and halides where the metal is lanthanum, cerium, praseodymium, neodymium, promethium, samarium, europium, gadolinium, terbium, dysprosium, holmium, erbium, thulium, ytterbium, or lutetium. Any deposition method that results in the metal hydride deposited on the substrate may be used. Suitable methods include, but are not limited to, sputtering and dispersion in a water or alcohol based solution. The solution may have a concentration of, for example, 0.00001 M to 1 M. A mask or other patterning technique may be used so that the metal halide is deposited only in the areas in which it is desired to subsequently grow the final material.

The metal halide 20 is then heated to melt it to liquid form. The entire system may be heated as well. One example suitable temperature range is about 500 to about 1200° C. The liquid metal halide 20 is then contacted with a vapor 30 that is used to form a material when deposited on the substrate. Suitable deposition methods include, but are not limited to, chemical vapor deposition (CVD), molecular beam epitaxy (MBE), hydride vapor phase epitaxy (HVPE), pulsed laser deposition (PLD), and atomic layer deposition (ALD). Many vapors used for such deposition systems are known. Any materials are suitable where the melting point of the material made by such deposition method has a melting point higher that the metal halide, and where the metal may be in solid solution in the material. For example, GaN and other III-nitrides may be made by CVD. Such III-nitrides may be made from vapors comprising, for example, ammonia, one or more of hydrogen, nitrogen, and argon, and one or more of trimethylgallium, trimethylaluminum, trimethylyindium, triethylgallium, triethylaluminum, and triethylindium. Rare earth elements are stable in their solid elemental forms in the pressure, temperature, and chemical ambient typical of a MOCVD system. Thus, an $ErCl_3$ compound may be used to alter the thermochemistry of a system to allow incorporation of Er in the GaN matrix.

The result of contacting the vapor 30 to the liquid metal halide 20 is the formation of a layer of a solid solution 40 of the metal in the material on the substrate 10. The remaining metal halide 20 floats on the top of the new layer 40. Additionally, other gases 50 may be discharged from the system. For example, when the metal halide is erbium chloride and the material is GaN, the discharged gases may include GaCl, $ErCl_3$, and HCl. Chlorides may generally function as a getter to remove excess metals and hydrogen.

The resulting solid solution may comprise nano- and/or micro-crystals or a continuous layer. The growth process may allow the precise positioning of optically active III-nitride nano- or micro-scale crystals. These rare-earth doped III-nitride crystals may be useful as light emitting devices and detectors as well as DMS transistors. One or more dissimilar III-nitride devices can be integrated onto one Si wafer (die). Alternatively, a continuous III-nitride film can be grown on the entire Si substrate with devices subsequent defined during processing. Additionally, the III-nitride devices can be integrated with Si electronics fabricated on the same Si substrate. The subject method may be achieved in a single reactor representing a single step in a larger device fabrication process flow.

Heteroepitaxial growth of GaN nanostructures is dependent on a number of parameters, including the presence of a surfactant or etchant, interfacial mismatch strain with a lattice-mismatched substrate and the underlying bonding of the substrate. During VLS growth, a metallic or rare-earth catalyst may enhance the growth via a supersaturation in the seed which leads to precipitation of the semiconductor crystal (Trentler et al., *Science*, 270, 1791 (1995); Holmes et al., *Science*, 287, 1471 (2000)). It is know that once a single grain crystal forms on the surface of a small-volume seed, this orientation is maintained and the growth rate is enhanced by the surfactant effect of the seed present at the growth surface (Wu et al., *J. Am. Chem. Soc.*, 123, 3165 (2001)). This is seen in this work by the growth of distinct GaN crystals in region with low-levels of dispersed seed. In contrast, this enhanced growth can become unrestrained for excessively large seed particles that can accommodate multiple nucleation sites (Kan et al., *Faraday Discuss.*, 125, 23 (2004)). This was seen in this study by the accumulation (clustering) of GaN crystal in regions with a higher density of seed.

Figure 7:
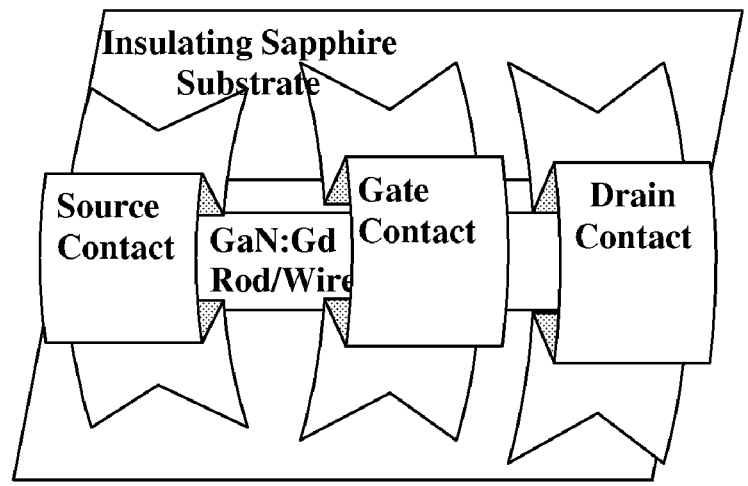
FIG. 7 shows a schematic of GaN:Gd DMS transistor.

A rare-earth chloride seeded growth process was developed for the fabrication of optically active GaN nanocrystals. Additionally, the horizontal geometry of these rare earth doped nano-crystals is intriguing for use as in-plane light emitting devices as well as DMS transistors (FIG. 7). The incorporation of rare-earth elements into a semiconductor matrix allows tunable optical transitions based on selection of the appropriate rare-earth dopants. The reduced growth temperature of the VLS deposition process is more compatible with the thermal stability of Si microelectronics.

Having described the invention, the following examples are given to illustrate specific applications of the invention. These specific examples are not intended to limit the scope of the invention described in this application.

EXAMPLE 1

GaN with $ErCl_3$ seeds on sapphire—GaN crystals were grown via an $ErCl_3$ seed on c-, a- and r-plane sapphire substrates. The $ErCl_3$ was dissolved into deionized water, then either dripped or spun onto the substrate. The substrate was heated to approximately 60° C. to drive off excess water, then loaded into a modified vertical impinging flow, metal organic chemical vapor deposition (MOCVD) reactor. A 50-Torr, $H_2$ atmosphere was used during the ramp to growth temperature. Trimethylgallium was flowed for 2 s prior to the onset of $NH_3$ flow to prevent nitridation of the Er seeds. A series of samples was produced for a growth duration of 1, 5, 10, 20, and 30 min. Results are presented for a growth temperature of 900° C. although this technique was demonstrated from 700 to 1050° C.

Structural characterization was performed with a Panalytical X'pert X-ray diffraction (XRD) system and a LEO FE Scanning Electron Microscope (SEM). The XRD characterization data can be considered as information from an ensemble of crystals within the approximately millimeter-diameter X-ray beam. The luminescence was excited at room temperature with the 325-nm line of a He—Cd laser. The uncorrected photoluminescence (PL) spectra were acquired with a small fiber optical spectrometer, which was fitted with an UV-extended linear CCD array and a grating blazed at 350 nm, coupled to a near-UV transmitting optical microscope. The real-color red/green/blue (RGB) and single-color (R, G, and B) optical images were obtained with a near-UV CCD camera fitted with a wheel filters attached to one of the microscope ports.

Figure 2:
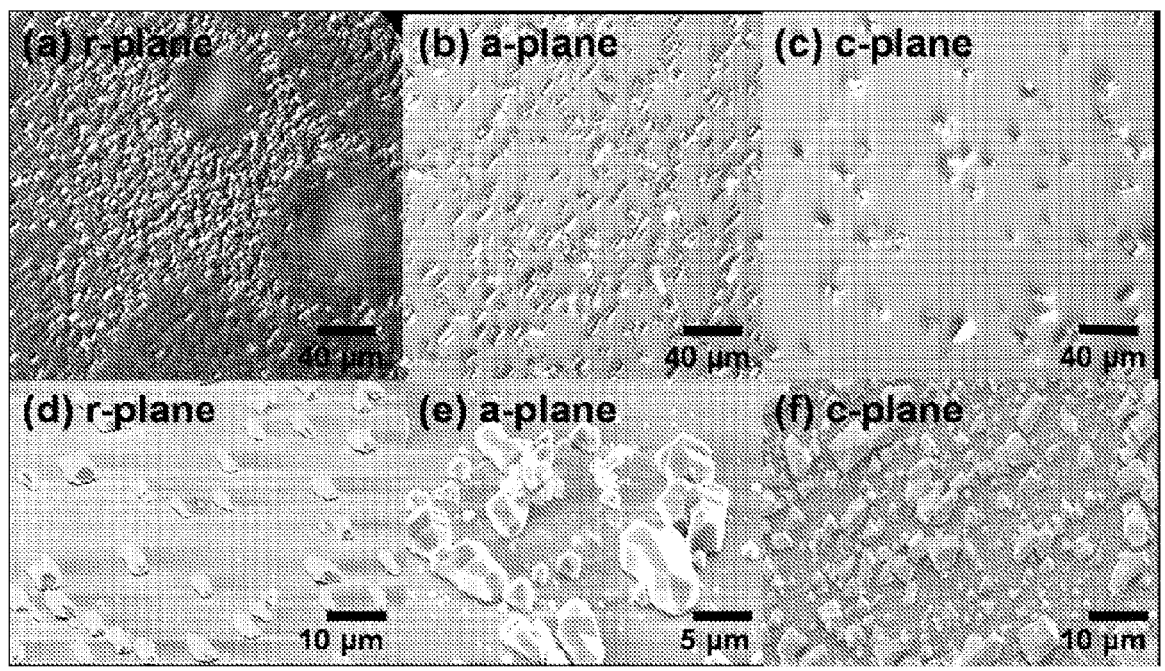
FIG. 2 shows Nomarski micrographs (a-c) and electron microscopy (d-f) of (a and d) a-plane GaN crystals on r-plane sapphire, (b and e) mixed m- and c-plane GaN crystals on a-plane sapphire, and (c and f) c-plane GaN crystal with no long range ordering on c-plane sapphire. The two large objects in (a) are resolidified rare-earth seed on top of a cluster of GaN crystals.
Figure 3:
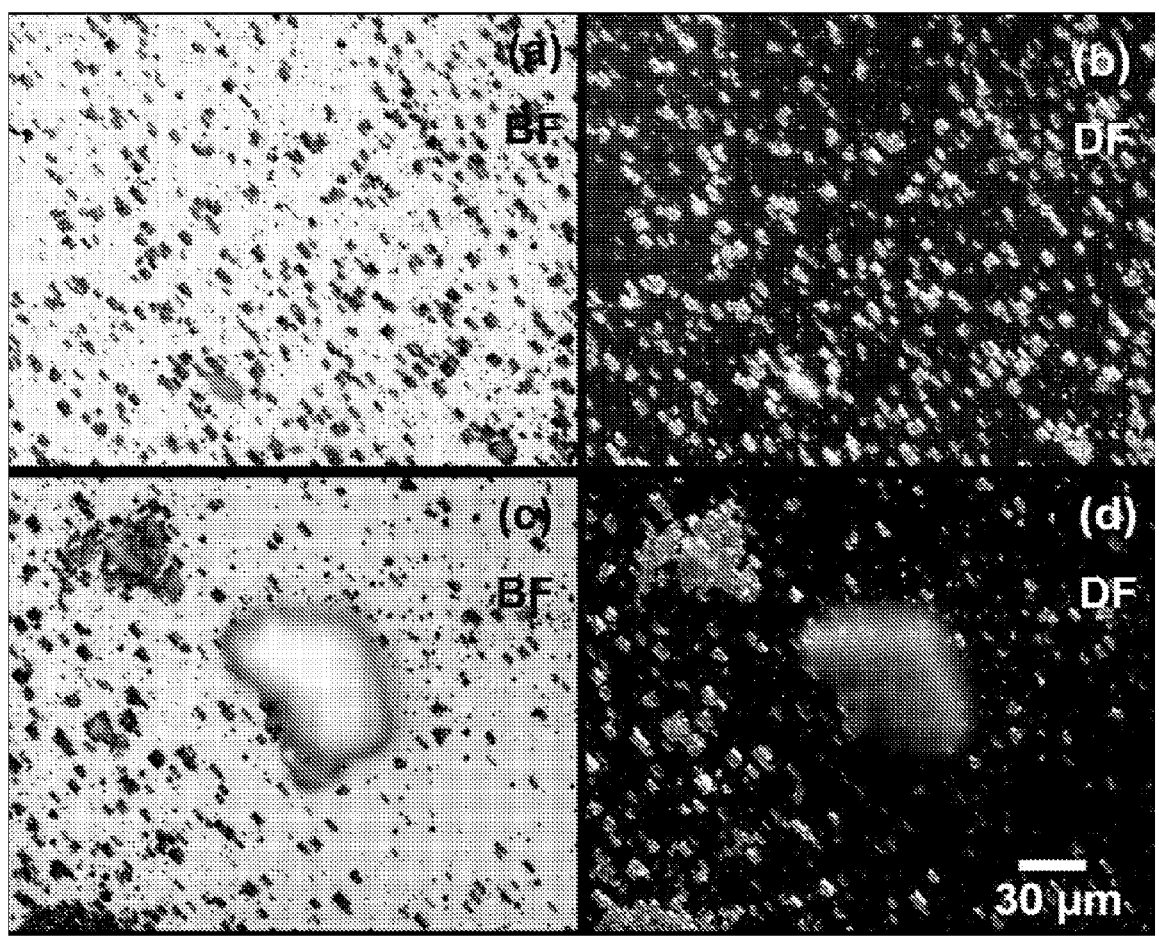
FIG. 3 shows (a and c) bright field and (b and d) dark field optical micrographs of GaN crystals. (a and b) Distinct GaN crystals are observable in a region of the substrate with a light application of seed. (c and d) Excessive concentration of the seed results in clustered growth of GaN crystals. The large object in the center of the figure is a resolidified seed located on top of a high-density crystal cluster.
Figure 4:
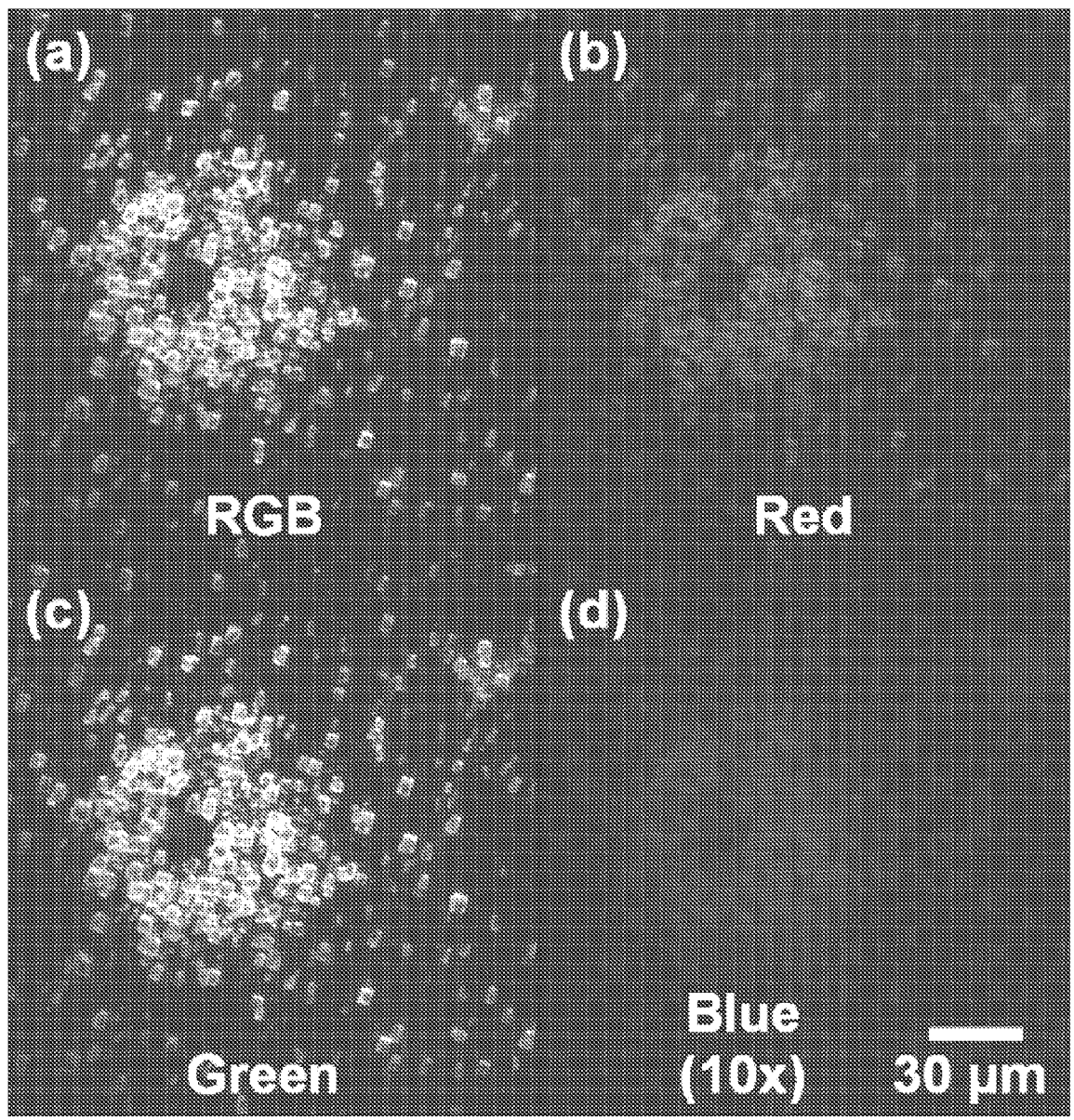
FIG. 4 shows luminescence micrographs of a cluster of GaN crystals illuminated with 325 nm HeCd laser line and acquired with a CCD fitted with a wheel filter. (a) Realcolor (RGB), (b) red filter, (c) green filter, and (d) blue filter, with 10 times longer integration time than the R and G pictures.

Bright field Normarski microscopy in FIGS. 2(*a-c*) and electron micrographs in FIGS. 2(*d-f*) reveal a high concentration of approximately 5-mm in length GaN crystals after 10 min of deposition on r-, c- and a-plane sapphire. X-ray diffraction showed the growth direction to be a-plane GaN on r-plane sapphire, mixed m- and c-plane GaN on a-plane sapphire, and c-plane GaN on c-plane sapphire. The elongated a- and m-plane GaN crystals showed a long-range ordering in contrast to the lack of symmetry in the arrangement of the c-plane GaN crystals (FIGS. 2 and 3). The size of the GaN crystals varied with growth time from tens of nanometers for a 1 min growth to tens or microns for a 30 min growth. The GaN crystals did maintain approximately the same geometric proportions for length:width:height independent of growth time. Optical analysis as seen in FIGS. 2 and 3 displayed low density regions of uniformly spaced crystals as well as high density regions in the vicinity of a concentrated $ErCl_3$ seed. Two such high-density cluster regions are present in the upper left and center of FIGS. 3(*c* and *d*). The crystal cluster in the center of FIGS. 3(*c* and *d*) is obscured by the resolidified rare-earth seed that is suspended on top of the GaN crystals. Also, a ring of negligible deposition was occasionally observed in the vicinity of the resolidified rare-earth seed (FIG. 2(*a*)). Luminescence images and spectrum of the GaN crystals are displayed in FIGS. 4-6. The RGB image of a region containing individual crystals and cluster of crystals, represented in FIG. 3*a*, displays visibly the bright green-yellow emission typical for these $Er^{3+}$ doped crystals. The individual red, green, and blue color pictures, represented in FIGS. 4(*b-d*), demonstrate that green is the dominant component of the crystal emission. In general, all the crystal clusters and individual crystals were optically active.

Figure 5:
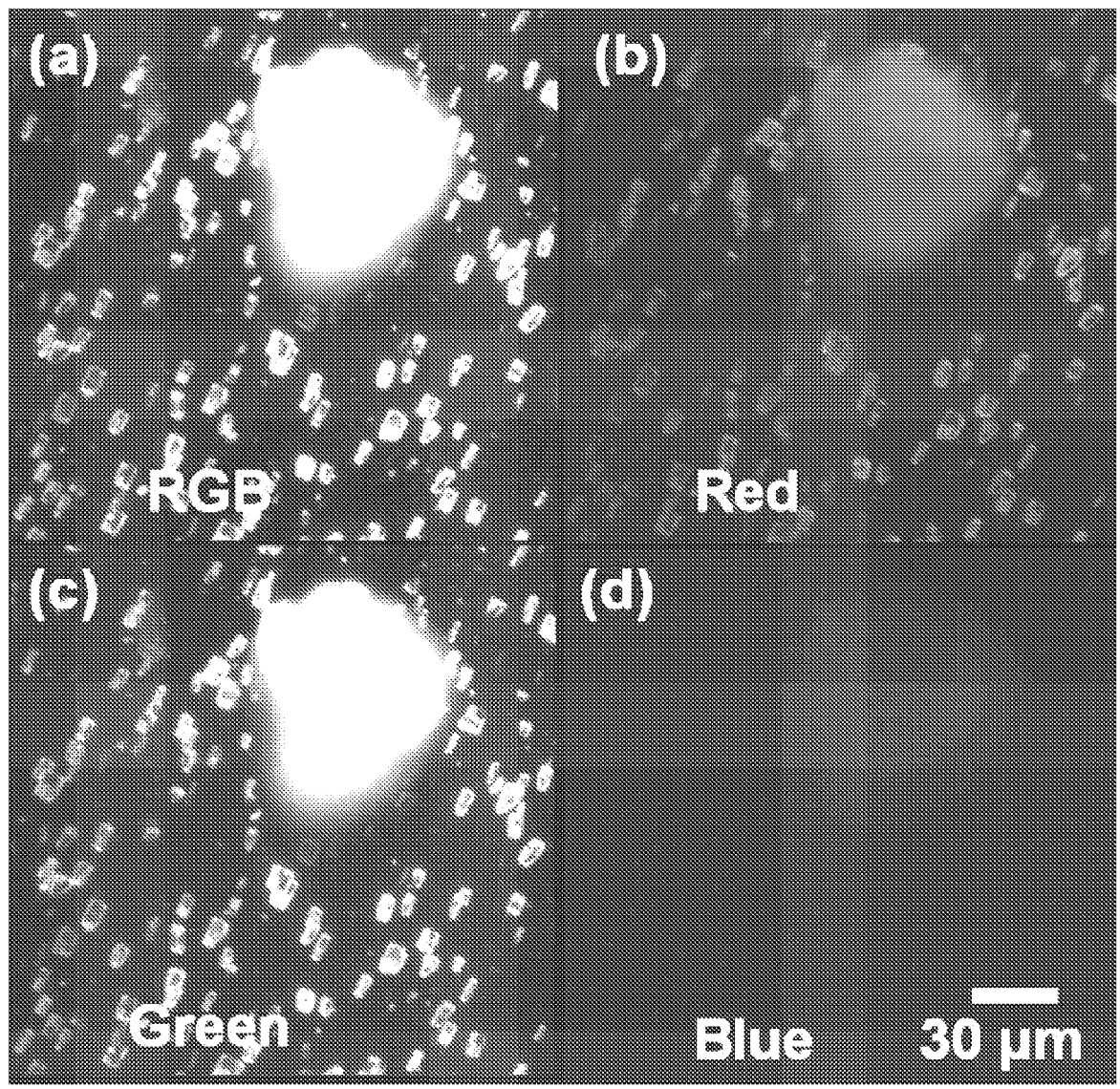
FIG. 5 shows luminescence micrographs of GaN crystals and a resolidified seed illuminated with 325 nm HeCd laser line and acquired with a CCD fitted with a wheel filter. (a) Real-color (RGB), (b) red filter, (c) green filter, and (d) blue filter (1×). A dense cluster of GaN crystals exists underneath the seed.
Figure 6:
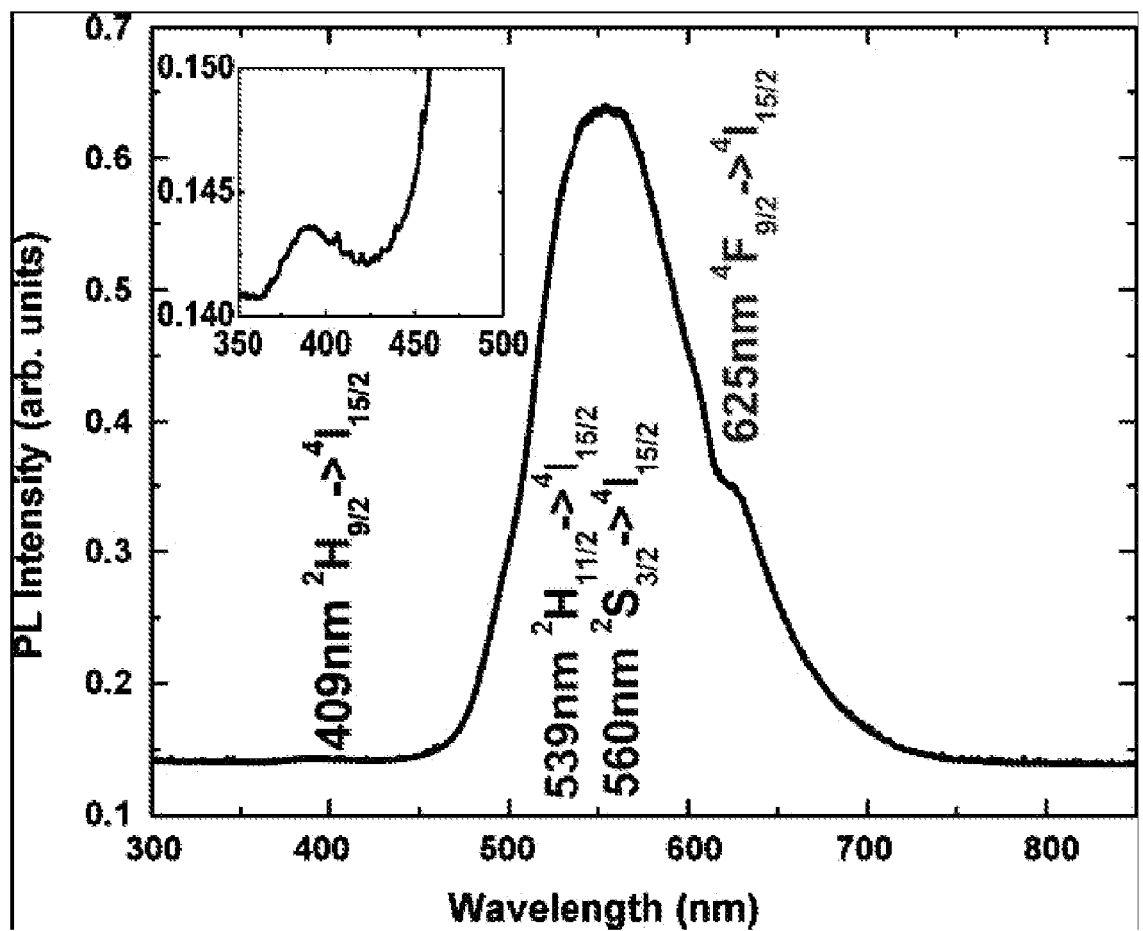
FIG. 6 shows a PL spectrum of GaN:Er crystal. Characteristic $Er^{3+}$ transitions are labeled for reference.

FIG. 5 shows the remains of a rare-earth seed that resolidified upon cooling from growth temperature. The location of the cluster of GaN crystals underneath this resolidified rare-earth seed was observed by varying the focus depth in the microscope. FIG. 6 depicts the uncorrected PL spectrum of the sample region represented in FIG. 4. A broad emission band extending from 450 to 750 nm with a peak near 560 nm dominates the emission spectra. Also observed is a weak emission band around 400 nm. To verify the nature of the recombination processes the PL spectra of a thin ($\leq 3$ μm) MOCVD GaN film on sapphire and of a thick ($\geq 200$ μm) hydride vapor phase epitaxy (HVPE) freestanding GaN film (not shown) were measured. It was observed that both films have similar spectra, and which are dominated by a relatively intense emission band extending from 400 to 650 nm with peak at 525 nm. The spectral intensity distribution of this band is quite different from the spectra observed from the GaN:Er crystallites. Presently, possible contribution of the 525 nm undoped GaN emission band to the GaN:Er crystallites spectra cannot be ruled out. However, the primary $Er^{3+}$ green transitions at ~539 nm ($^2H_{11/2} \rightarrow {}^4I_{11/2}$), the yellow transition at ~560 nm ($^2S_{3/2} \rightarrow {}^4I_{15/2}$) and the red transition at 625 nm ($^4F_{9/2} \rightarrow {}^4I_{15/2}$) can be clearly distinguished. In addition, a weak violet Er3+ transitions at ~409 nm ($^2H_{9/2} \rightarrow {}^4I_{15/2}$) was observed, which may overlap with a weaker GaN bandedge emission.

FIGS. 3 and 5 of the rare-earth seed on top of the GaN crystal clusters is telling as this is a snap shot of an uncompleted catalysis-enhanced reaction. The presence of the metallic seed at the end of a semiconductor nano-wire is often cited as proof of the VLS mechanism (Trentler et al., *Science*, 270, 1791 (1995); Holmes et al., *Science*, 287, 1471 (2000)). In this work it may also be desired to similarly enhance the GaN growth by forming a Ga—Er—N liquid alloy wherein the GaN diffuses through this liquid to the growth front of the crystal. In contrast to traditional VLS growth, here it is desired to intentionally dissolve this rare-earth seed into the semiconductor matrix. This solubility of Er into the GaN host via a rare-earth chloride seed was confirmed by the presence of $Er^{3+}$ luminescent transitions in FIG. 6. In this study, it is demonstrated that the choice of substrate influences the growth mechanism. The standard for GaN fabrication is in the c-direction [0 0 0 1] on c-plane (0 0 0 1) sapphire. a-Plane (1 1-2 0) GaN can be deposited readily by employing r-plane (1-1 0 2) sapphire (Eddy Jr. et al., *J. Electron. Mater.*, 34(9), 1187 (2005)). Epitaxy on a-plane (1 1-2 0) sapphire can yield either c- or m-plane (1-1 0 0) GaN by adjusting the conditions of growth (Doppalapudi et al., *J. Appl. Phys.*, 85, 3582 (1999); Kato et al., *J. Cryst. Growth*, 173, 244 (1997)). This corresponds well with the results in this study that showed crystals of a-plane, c-plane, and mixed m- and c-plane GaN on r-plane, c-plane, and a-plane sapphire, respectively. Qualitatively, there was an increase in the ratio of aligned m-plane (or a-plane) crystals to random c-plane crystals in areas of the a-plane (or r-plane) sapphire with a high density of seed. Evidently, the presence of the catalyst alters the epitaxial relationship of GaN with the substrate.

One additional influence on the growth is the Cl atom in the seed, which will react with free Ga to form a GaCl reactant similar to the reaction chemistry in HVPE. Conversely, an excess accumulation of Cl will act as an etchant that locally suppresses nucleation (Mastro et al., *Mater. Res. Soc. Symp. Proc.*, 764, C2.2 (2003); Mastro et al., *Solid State Electron.*, 48, 179 (2004)).

EXAMPLE 2

Additional characterization—GaN crystals were grown via an $ErCl_3$ seed dispersed in a methanol solvent onto an a-plane sapphire substrates as described above. A LEO Field Emission Scanning Electron Microscope (SEM) and a FEI NOVA 200 SEM with energy dispersive x-ray (EDX) analysis was used to mill and analyze GaN micro-crystals. A Ga-ion beam was used to characterize the cross-section of GaN micro-crystal. A LabRam high resolution Jobin Yvon system fitted with a liquid nitrogen cooled CCD was employed for micro-Raman spectroscopy under backscattering geometry with a 632 nm He—Ne laser. The laser power was 0.6 mW at the sample surface after passing through the microscope internal optics. The sample was positioned by a motorized computer controlled stage.

Figure 8:
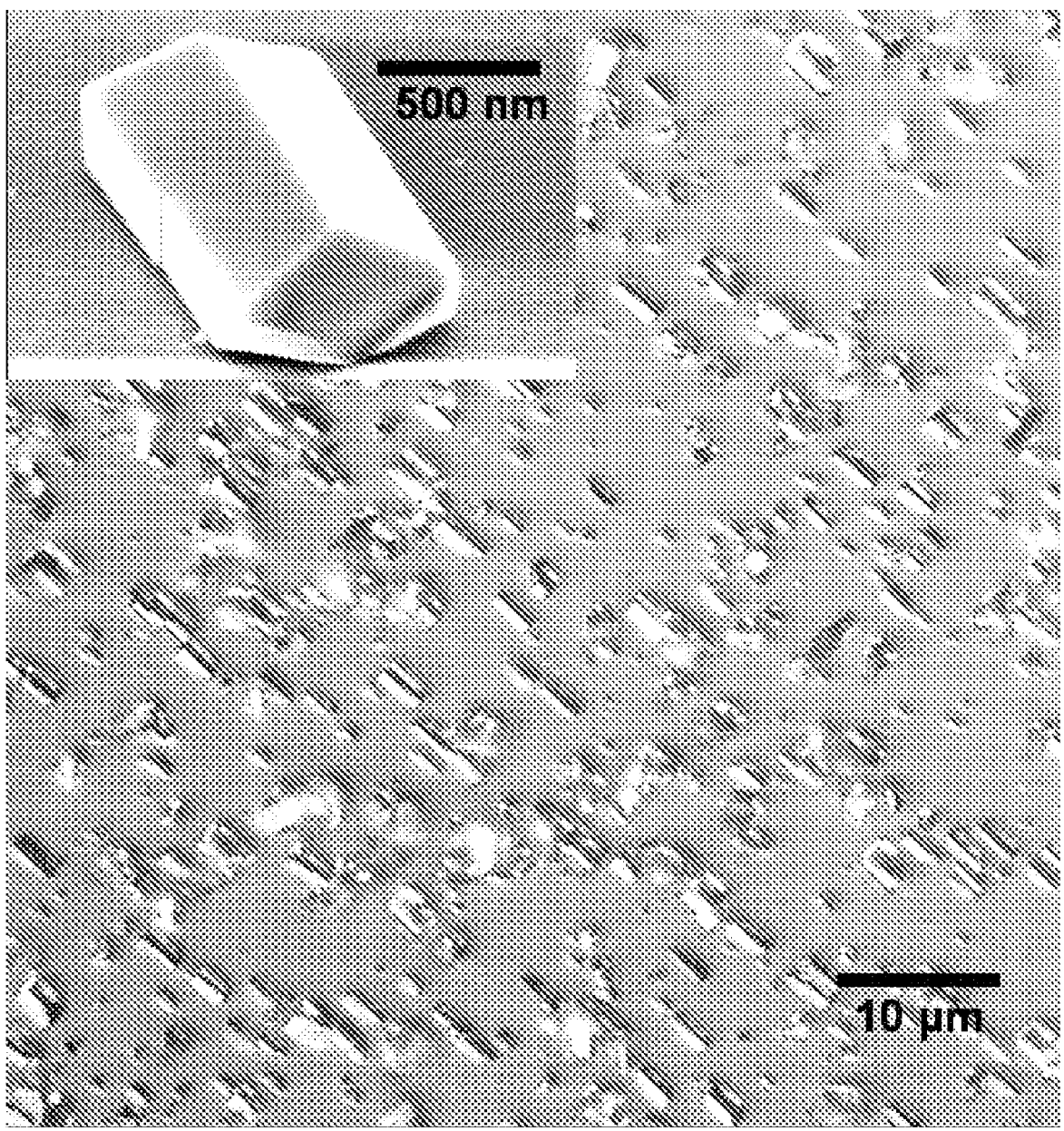
FIG. 8 shows a Nomarski micrograph and electron microscopy (insert) of mixed m- and c-plane GaN crystals on a-planesapphire. Individual/single GaN crystals are only observable in a region of the substrate with a light application of the $ErCl_3$ seed.

Bright field Normarski microscopy and electron micrographs in FIG. 8 reveal a high concentration of GaN crystals approximately 5-μm in length after 10 min of growth on a-plane sapphire. X-ray diffraction showed the growth direction to be mixed m- and c-plane GaN on a-plane sapphire, with some crystallizes having m-plane orientation and others having c-plane orientation. The elongated m-plane GaN crystals displayed a long-range ordering in contrast to the lack of symmetry in the arrangement of the c-plane GaN crystals. The size of the GaN crystals varied with growth time from tens of nanometers for a 1-min growth to tens of microns for a 30-min growth. The GaN crystals did maintain approximately the same geometric proportions for length:width: height independent of growth time.

Figure 9:
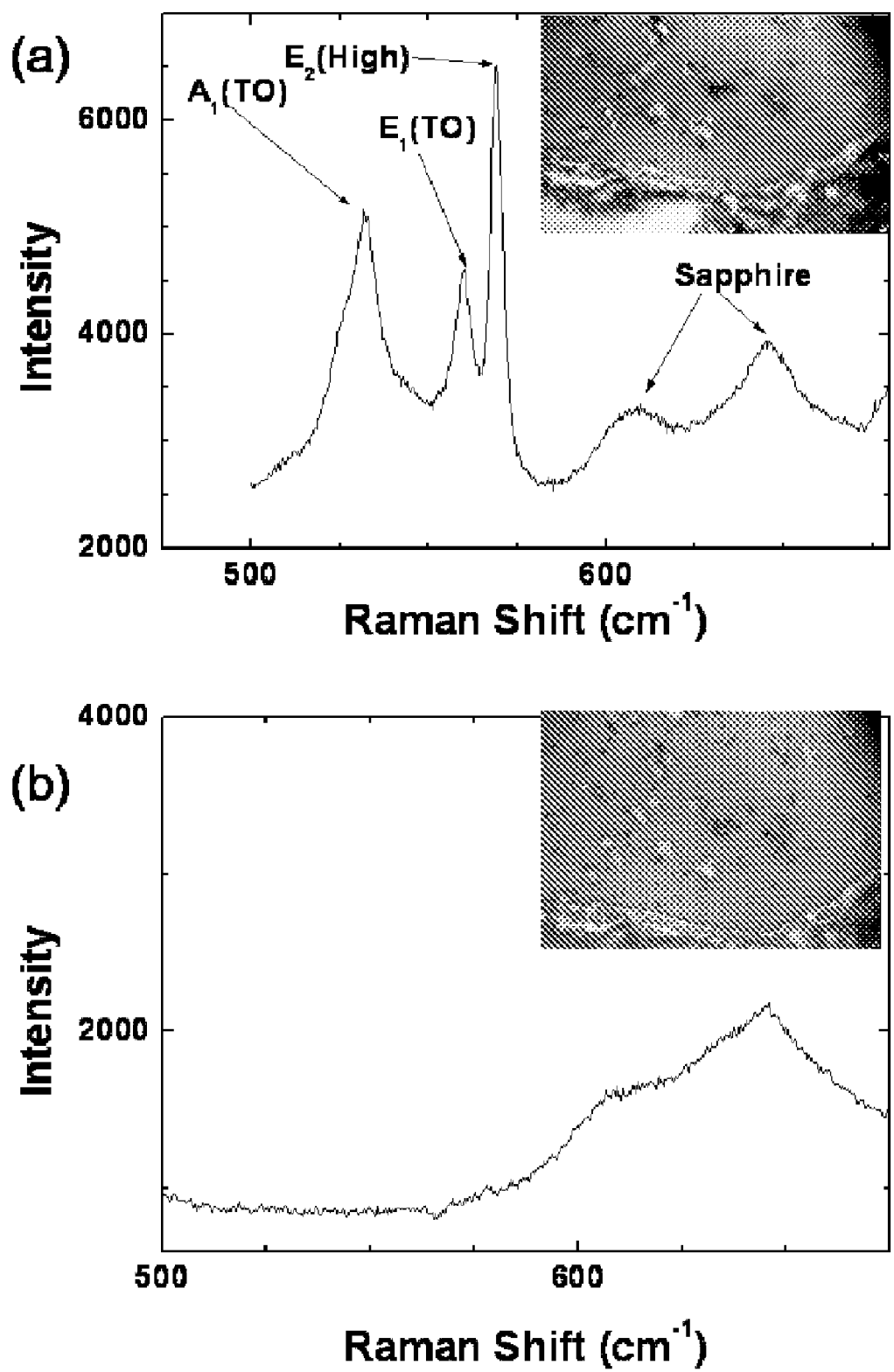
FIG. 9 shows micro-Raman characterization with the beam focused at center of the red cross on an (a) Er-doped GaN nanorod and (b) area adjacent to the nanorod.

Traditional Raman spectroscopy utilizes a long-wavelength laser line to probe a relatively large area of a sample or an ensemble of nano-structures. This study employed a micro-Raman technique, which uses a short-wavelength laser line (632 nm) to probe individual nano-scale structures. FIG. 9 displays micro-Raman scattering from individual nanocrystals. In FIG. 9(*a*), distinct GaN E2, E1(TO), and A1 (TO) phonons are observable. This data indicates that the GaN nanocrystals have a structural quality similar to that obtained from a high quality freestanding GaN wafer (Kim et al., *Phys. Stat. Sol.* (*a*), 203, 2393 (2006)). No characteristic GaN peak was measured when the laser was positioned off the GaN nanocrystal in FIG. 9(*b*). Strong GaN E2, A1 (TO), E1 (TO) Raman scattering was only observable directly on the nanocrystals, which indicates that GaN was selectively grown only at the location of the $ErCl_3$ seed.

Figure 10:
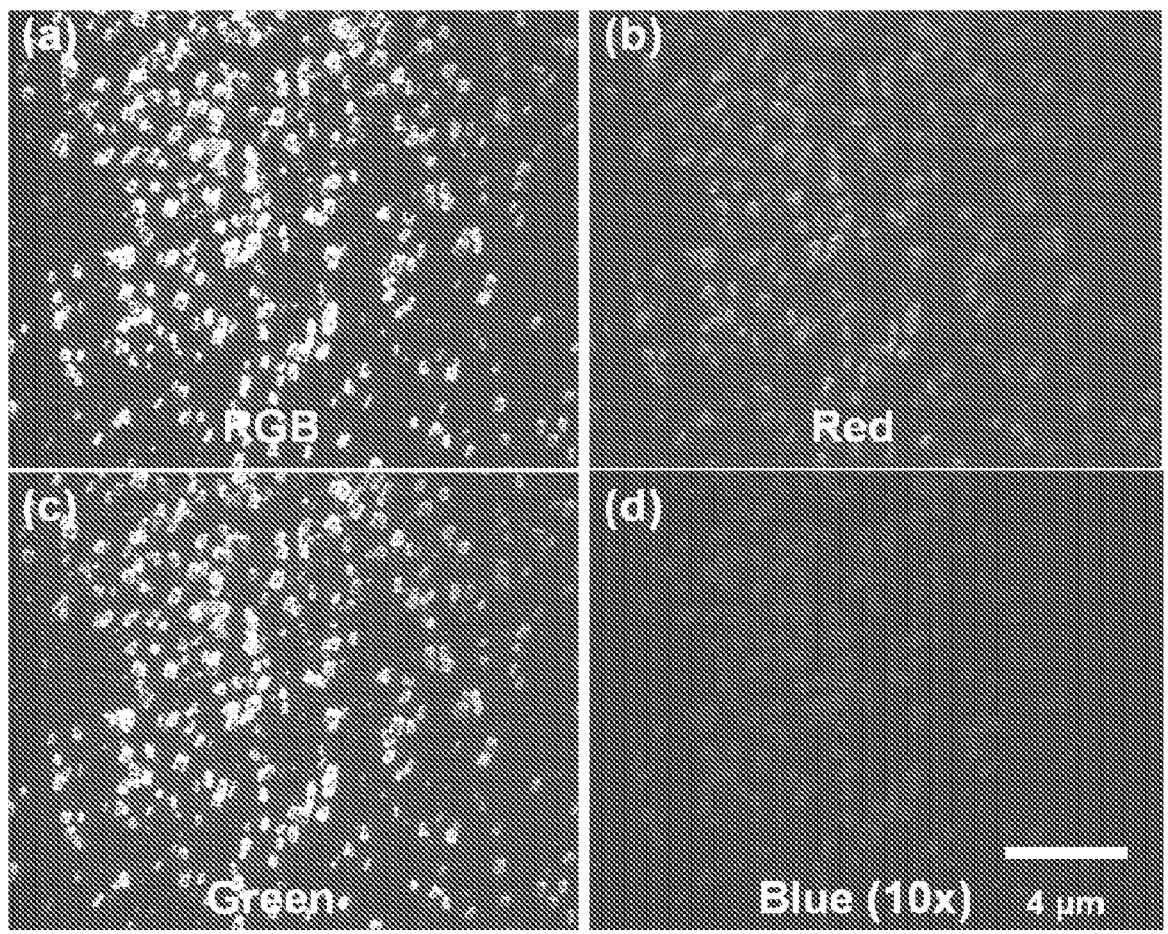
FIG. 10 shows luminescence micrographs of a high density of GaN nanocrystals illuminated with 325-nm HeCd laser line and acquired with a CCD fitted with a filter wheel: (a) Real-color (RGB), (b) Red filter, (c) Green filter, and (d) Blue filter, with 10 times longer integration time than the R and G pictures.
Figure 11:
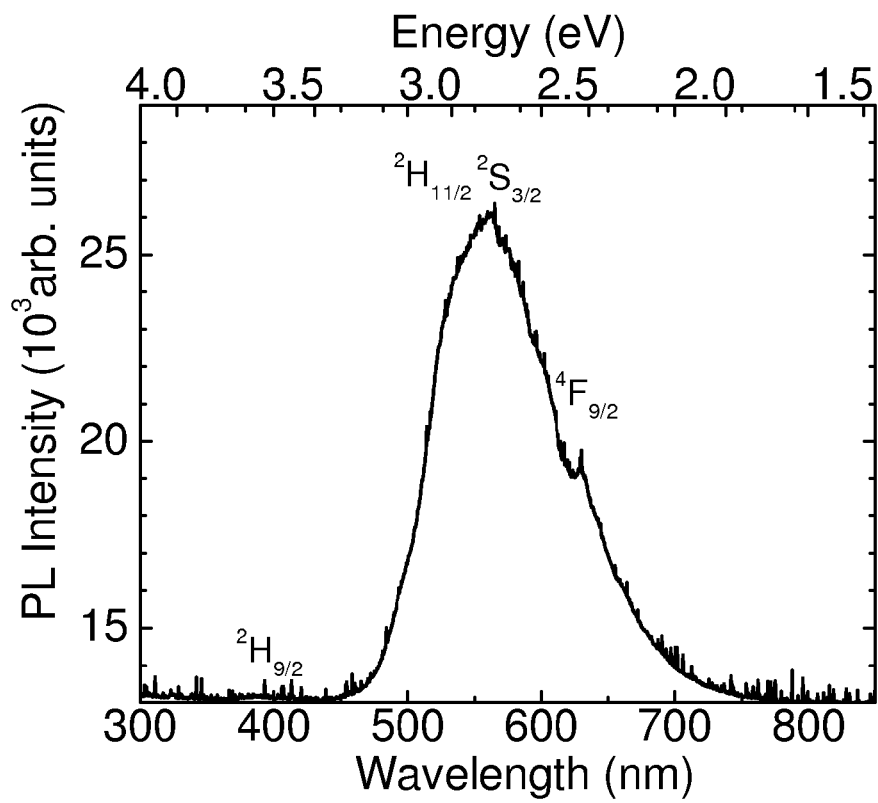
FIG. 11 shows a PL Spectrum of GaN:Er crystal. Characteristic $Er^{3+}$ transitions are labeled for reference. The primary $Er^{3+}$ green transitions at 539 nm ($^2H_{11/2} \rightarrow {}^4I_{15/2}$), the yellow transition at 560 nm ($^2S_{3/2} \rightarrow {}^4I_{15/2}$), and the red transition at 625 nm ($^4F_{9/2} \rightarrow {}^4I_{15/2}$). In addition, a weak blue-violet $Er^{3+}$ transition emits at 409 nm ($^2H_{9/2} \rightarrow {}^4I_{15/2}$), which overlaps with a weaker GaN bandedge emission.

Luminescence images and spectrum of the GaN crystals are displayed in FIGS. 10 and 11. The RGB image of a region containing individual crystals, represented in FIG. 10(*a*), displays visibly the bright green-yellow emission typical for these $Er^{3+}$ doped crystals. The individual red, green, and blue color pictures, represented in FIGS. 10(*b-d*), demonstrate that green is the dominant component of the crystal emission.

FIG. 11 depicts the uncorrected PL spectrum of the sample region represented in FIG. 10. A broad emission band extending from 450 nm to 750 nm with a peak near 560 nm dominates the emission spectra. This dominant band is dissimilar to the 525 nm defect emission band commonly observed in GaN (Caldwell et al., *Appl. Phys. Lett.*, 88, 263509 (2006)). Also observed is a weak emission band at approximately 400 nm.

Erbium occupies an isoelectronic substitutional site in the GaN matrix; specifically, $Er^{3+}$ substitutes a Ga site with $C_{3v}$ symmetry. This trap has a large carrier cross-section, which leads to a strong interaction of the partially filled Er 4f shell with free carriers (Kenyon, *Prog. In Quant. Mech.*, 26, 225 (2002)). The $5s^2$ and $5p^6$ electrons in Er shield the 4f electrons and, consequently, the energy levels of the Er ion are fairly distinct. Still, Stark splitting can broaden the energy levels, particularly at room temperature, to produce an inhomogeneous broadened emission spectrum (Id.) as is observable in FIG. 11.

Figure 12:
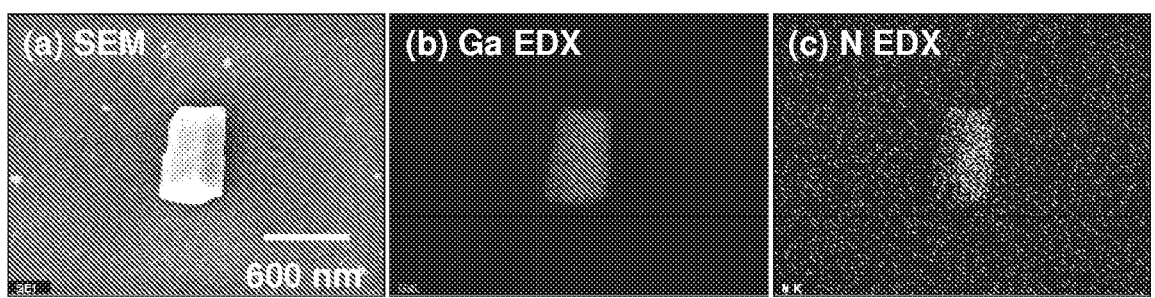
FIG. 12 shows a (a) SEM and (b,c) EDX image of a GaN:Er nanorod. A characteristic EDX signal from the Er atoms was detected although this lacked a sufficient signal to noise ratio to generate an image.
Figure 13:
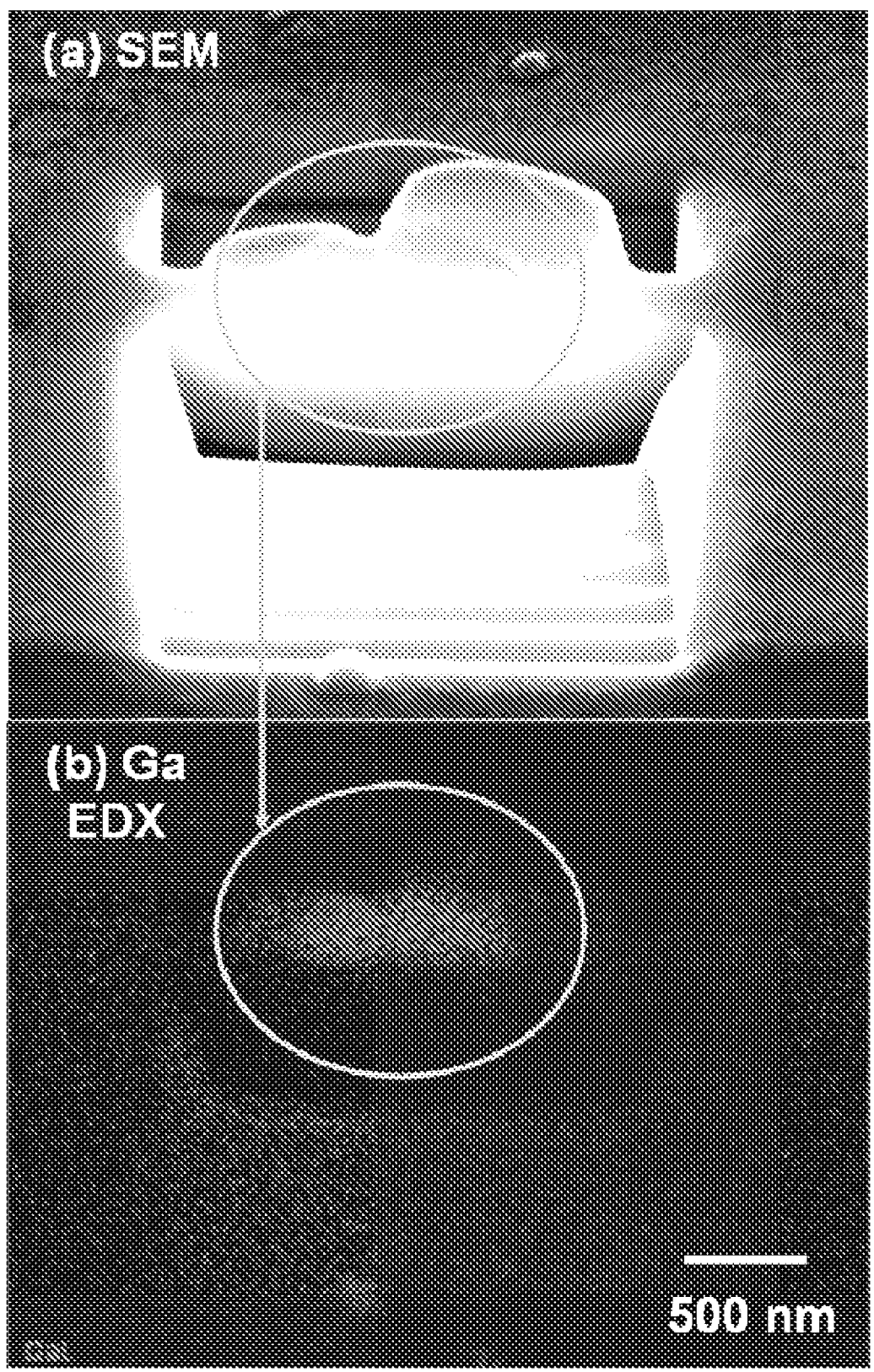
FIG. 13 shows a cross-sectional (a) SEM and (b) EDX image of a GaN:Er nanorod. Focused Ion Beam milling was employed to cut across an Er-doped GaN nanorod. Etching on both sides of the Er-doped GaN nanocrystal produced a sharp cross-section.

A SEM equipped with an EDX system was used to study the chemical composition of the nanocrystals. An overview of an as-grown nanocrystal is presented in FIG. 12. Similarly, FIG. 13 presents a cross-sectional view of a nanocrystal that was milled with a focused ion beam to expose the inside of the nanocrystal. The EDX data confirm that these nanocrystals are made of Ga and N and Er impurities were detected across the nanocrystal. Additionally, no GaN or Er was detected outside the crystal confirming the growth was selective to the location of the $ErCl_3$ seed.

This study demonstrated a directional-dependent enhancement in the growth GaN crystals by initially forming a Ga—Er—N liquid alloy wherein the liquid seed segregates to the growth front of the crystal. In contrast to traditional metal (Ni, Au, Fe) seeded growth, here it is desired to intentionally dissolve this rare-earth seed into the semiconductor matrix. This solubility of Er into the GaN host via a rare-earth chloride seed was confirmed by the presence of $Er^{3+}$ luminescent transitions in FIG. 12. The presence of excess $ErCl_3$ seed or phase segregated Er was not observed by optical and electron microscopy. Additionally, the lack of emission levels characteristic of Er, ErN or $ErCl_3$ (ref for these levels) provides further confirmation that Er is present only as $Er^{3+}$ ions embedded in the GaN matrix.

Obviously, many modifications and variations of the present invention are possible in light of the above teachings. It is therefore to be understood that the claimed invention may be practiced otherwise than as specifically described. Any reference to claim elements in the singular, e.g., using the articles "a," "an," "the," or "said" is not construed as limiting the element to the singular.

What is claimed is:

1. A deposition method comprising:
   depositing a metal halide on a substrate;
      wherein the metal is a rare earth metal or a transition metal;
   providing a vapor that forms a material when deposited on the substrate;
   heating the metal halide to a temperature at or above the melting point of the metal halide and at or below the melting point of the material;

contacting the metal halide with the vapor to cause growth on the substrate of a solid solution of the metal halide in the material.

2. The method of claim 1, wherein the substrate comprises sapphire, SiC, silicon, ZnO, $LiGaO_2$, $LiAlO_2$, MgO, AlN, or GaN.

3. The method of claim 2, wherein the substrate comprises a III-nitride layer on the substrate.

4. The method of claim 1, wherein the metal halide is a metal chloride.

5. The method of claim 1, wherein the metal halide is erbium chloride.

6. The method of claim 1, wherein the metal halide is a rare earth chloride.

7. The method of claim 1, wherein the metal of the metal halide is lanthanum, cerium, praseodymium, neodymium, promethium, samarium, europium, gadolinium, terbium, dysprosium, holmium, erbium, thulium, ytterbium, or lutetium.

8. The method of claim 1, wherein the metal halide is deposited by sputtering or dispersion in a water or alcohol based solution.

9. The method of claim 1, wherein the material comprises a III-nitride.

10. The method of claim 1, wherein the material comprises gallium nitride.

11. The method of claim 1, wherein the vapor comprises: ammonia;
one or more of hydrogen, nitrogen, and argon; and
one or more of trimethylgallium, trimethylaluminum, trimethylindium, triethylgallium, triethylaluminum, and triethylindium.

12. The method of claim 1, wherein the metal halide is heated to a temperature of about 500 to about 1200° C.

13. The method of claim 1, wherein the metal halide is erbium chloride and the material comprises gallium nitride.

14. The method of claim 1, wherein depositing the metal hydride comprises the use of a mask to form a pattern of the metal hydride on the substrate.

15. The method of claim 1, wherein the material is formed from the vapor by chemical vapor deposition.

16. The method of claim 1, wherein the material is formed from the vapor by molecular beam epitaxy, hydride vapor phase epitaxy, pulsed laser deposition, or atomic layer deposition.

* * * * *